United States Patent
Hamada et al.

(10) Patent No.: US 12,265,324 B2
(45) Date of Patent: Apr. 1, 2025

(54) AGGLUTINANT FOR PELLICLE, PELLICLE, EXPOSURE ORIGINAL PLATE WITH PELLICLE, METHOD FOR PRODUCING SEMICONDUCTOR DEVICE, METHOD FOR PRODUCING LIQUID CRYSTAL DISPLAY BOARD, METHOD FOR REGENERATING EXPOSURE ORIGINAL PLATE, AND PEELING RESIDUE REDUCTION METHOD

(71) Applicant: Shin-Etsu Chemical Co., Ltd., Tokyo (JP)

(72) Inventors: Yuichi Hamada, Annaka (JP); Akinori Nishimura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 358 days.

(21) Appl. No.: 17/603,933

(22) PCT Filed: Apr. 15, 2020

(86) PCT No.: PCT/JP2020/016628
§ 371 (c)(1),
(2) Date: Oct. 14, 2021

(87) PCT Pub. No.: WO2020/213662
PCT Pub. Date: Oct. 22, 2020

(65) Prior Publication Data
US 2022/0214613 A1 Jul. 7, 2022

(30) Foreign Application Priority Data

Apr. 16, 2019 (JP) .................................. 2019-077837
Apr. 23, 2019 (JP) .................................. 2019-082301
Apr. 23, 2019 (JP) .................................. 2019-082302

(51) Int. Cl.
*G03F 1/64* (2012.01)
*G03F 1/26* (2012.01)
(Continued)

(52) U.S. Cl.
CPC .................. *G03F 1/64* (2013.01); *G03F 1/26* (2013.01); *G03F 1/66* (2013.01); *G03F 7/70983* (2013.01); *H01L 21/0274* (2013.01)

(58) Field of Classification Search
None
See application file for complete search history.

(56) References Cited

U.S. PATENT DOCUMENTS 3,287,205 A * 11/1966 Bugel .................... C09J 129/10
                                                                    428/416
3,308,002 A * 3/1967 Hurwich .............. B65H 37/007
                                                                    156/577
(Continued)

FOREIGN PATENT DOCUMENTS

CN          202615264 U    * 12/2012
EP          570815 A2      * 11/1993   ............. G03F 3/102
(Continued)

OTHER PUBLICATIONS

International Search Report issued in corresponding International Patent Application No. PCT/JP2020/016628 dated Jul. 14, 2020.
(Continued)

*Primary Examiner* — Martin J Angebrannndt
(74) *Attorney, Agent, or Firm* — Morgan, Lewis & Bockius LLP

(57) ABSTRACT

Provided is an agglutinant for pellicles that can reduce residues stuck onto an exposure original plate when a pellicle is peeled from the exposure original plate after being used in lithography, and also provided are a pellicle, an exposure original plate with a pellicle, a method for regen- (Continued)

erating an exposure original plate, and a peeling residue reduction method.

16 Claims, 1 Drawing Sheet

(51) Int. Cl.
  *G03F 1/66* (2012.01)
  *G03F 7/00* (2006.01)
  *H01L 21/027* (2006.01)

(56) References Cited

U.S. PATENT DOCUMENTS

| | | | | |
|---|---|---|---|---|
| 4,033,918 A | * | 7/1977 | Hauber | C09J 129/10 |
| | | | | 524/297 |
| 5,643,654 A | | 7/1997 | Fujita et al. | |
| 2014/0087191 A1 | * | 3/2014 | Chua | B32B 37/025 |
| | | | | 428/408 |
| 2018/0059536 A1 | * | 3/2018 | Hamada | G03F 1/64 |
| 2018/0290182 A1 | | 10/2018 | Park et al. | |
| 2022/0113623 A1 | * | 4/2022 | Hamada | G03F 1/64 |

FOREIGN PATENT DOCUMENTS

| | | | | | |
|---|---|---|---|---|---|
| JP | 06148871 | A | * | 5/1994 | |
| JP | 07061204 | | * | 3/1995 | |
| JP | 08152709 | A | * | 6/1996 | ......... B29C 63/0013 |
| JP | 2001022052 | A | * | 1/2001 | ............... G03F 1/84 |
| JP | 2001-83691 | A | | 3/2001 | |
| JP | 2001083691 | A | * | 3/2001 | ............... G03F 1/62 |
| JP | 2001343738 | A | * | 12/2001 | |
| JP | 2003-082302 | A | | 3/2003 | |
| JP | 2003-096215 | A | | 4/2003 | |
| JP | 2006-146085 | A | | 6/2006 | |
| JP | 2007-041545 | A | | 2/2007 | |
| JP | 2007-156397 | A | | 6/2007 | |
| JP | 2008-021182 | A | | 1/2008 | |
| JP | 5638693 | B2 | | 12/2014 | |
| JP | 2016-018008 | A | | 2/2016 | |
| JP | 2018-013583 | A | | 1/2018 | |
| KR | 100405311 | | * | 11/2003 | |
| KR | 20100055161 | | * | 5/2010 | |
| KR | 101700092 | | * | 1/2017 | |
| KR | 10-2017-0028834 | A | | 3/2017 | |
| WO | WO-0137044 | A1 | * | 5/2001 | ............ C08F 214/18 |

OTHER PUBLICATIONS

Extended European Search Report issued in corresponding European Patent Application No. 20791600.8 dated Apr. 25, 2023.
Office Action dated Jul. 29, 2024, issued in corresponding Korean Patent Application No. 10-2021-7037397.

* cited by examiner

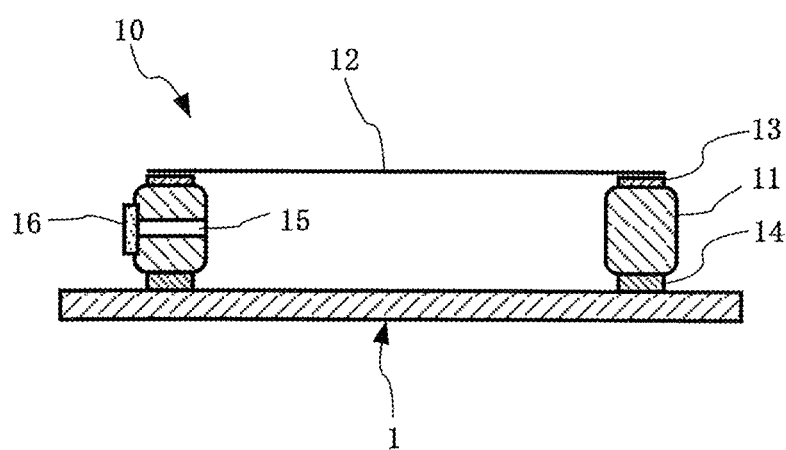

AGGLUTINANT FOR PELLICLE, PELLICLE, EXPOSURE ORIGINAL PLATE WITH PELLICLE, METHOD FOR PRODUCING SEMICONDUCTOR DEVICE, METHOD FOR PRODUCING LIQUID CRYSTAL DISPLAY BOARD, METHOD FOR REGENERATING EXPOSURE ORIGINAL PLATE, AND PEELING RESIDUE REDUCTION METHOD

FIELD OF THE INVENTION

The present invention relates to an agglutinant for pellicles, a pellicle, an exposure original plate with a pellicle, a method for producing a semiconductor device, a method for producing a liquid crystal display board, a method for regenerating an exposure original plate, and a peeling residue reduction method.

TECHNICAL BACKGROUND OF THE INVENTION

In manufacturing semiconductor devices such as LSI and super-LSI or in manufacturing a liquid crystal display board or the like, a pattern is made by irradiating light to a semiconductor wafer or an original plate for liquid crystal, but if dust is attached to an exposure original plate used in this case, the dust absorbs the light or bends the light. As a result, the transferred pattern would be deformed, and the resulting pattern would have roughened edges or black stains on the base, which would lead to problems such as damaged dimensions, poor quality, and deformed external appearance. In the present invention, the "exposure original plate" is a generic name of lithography masks and reticles.

These works are usually performed in a cleanroom, but it is difficult to keep the exposure original plate clean all the time even in the cleanroom. Therefore, a pellicle that transmits light for exposure well is bonded to a surface of the exposure original plate as a dust-fender.

Under such circumstances, the dust does not directly adhere to the surface of the exposure original plate but adhere only to the pellicle film. Accordingly, when the focus is set on the pattern of the exposure original plate during lithography, the dust on the pellicle film becomes irrelevant to transfer.

The basic structure of the pellicle comprises a pellicle frame and a pellicle film stretched over the pellicle frame. The pellicle film is made of nitrocellulose, cellulose acetate, a fluorine-based polymer, or the like that well transmits light used for exposure (g-rays, i-rays, 248 nm, 193 nm, 157 nm, etc.). The pellicle frame is made of an aluminum alloy such as A7075, A6061, or A5052 treated with black alumite or the like, stainless steel, polyethylene, or the like. A good solvent of a pellicle film is applied to the upper part of the pellicle frame, and the pellicle film is bonded by air-drying or using an adhesive material such as an acrylic resin, an epoxy resin, or fluororesin. Further, since the lower part of the pellicle frame is mounted with an exposure original plate, an agglutinant layer obtained from a polybutene resin, a polyvinyl acetate resin, an acrylic resin, a silicone resin, or the like, and a protective liner for protecting the agglutinant layer are provided.

The pellicle is provided so as to surround a pattern region formed on the surface of the exposure original plate. Since the pellicle is provided to prevent the adhesion of dust to the exposure original plate, the pattern region and the outside of the pellicle are isolated from each other so that dust from the outside of the pellicle does not adhere to the pattern surface.

In recent years, miniaturization of LSI design rules to sub-quarter microns has progressed. Along with this, the wavelength of exposure light sources is becoming shorter. That is, the trend is moving from g-rays (436 nm) and i-rays (365 nm) produced by mercury lamps, which have been the mainstream until now, to KrF excimer laser (248 nm), ArF excimer laser (193 nm), $F_2$ laser (157 nm), and the like. As a result of progress in miniaturization, the allowable size of foreign substances and haze that may be generated on the pattern face of the mask substrate to which the pellicle is bonded is becoming more and more strict.

PRIOR ART PUBLICATIONS

Publications

IP Publication 1: Japanese Patent No. 5638693
IP Publication 2: Japanese Patent Application Publication No. 2016-18008
IP Publication 3: Japanese Patent Application Publication No. 2006-146085
IP Publication 4: Japanese Patent Application Publication No. 2008-21182

SUMMARY OF THE INVENTION

Problems the Invention Seeks to Solve

In recent years, phase shift films have been commonly used as mask substrate films to meet the miniaturization of design rules. However, phase shift films are very delicate, and mask cleaning under excessive conditions may cause damage, such as corrosion and scraping, to the phase shift films. For this reason, in recent years, there has been a tendency to reconsider chemicals used for mask cleaning, and to weaken the cleaning conditions.

Furthermore, the mask pattern of advanced mask products is shifting from positive type mask patterns, which have been the mainstream until now, to negative type mask patterns. As a result, there are many situations where no light-shading layer is provided in the portion to which the pellicle is bonded. If there is no light-shading layer, there is a possibility that the pellicle agglutinant is irradiated with an exposure light beam through the mask substrate. In that case, more residues of the agglutinant layer may remain on the mask substrate when the pellicle is peeled.

During use of a pellicle bonded to a mask, if foreign substances and haze are generated, or if the pellicle film is damaged, it is necessary to peel the pellicle, subject the mask to regeneration cleaning, and bond a new pellicle (which is hereinafter referred to as "repellicle"). It is the most important for repellicle that regeneration cleaning is performed so that the mask is kept in a state of high cleanliness; however, in order to carry out regeneration cleaning of the mask under recent weak cleaning conditions, it is important to reduce residues remaining on the mask substrate when the pellicle is peeled.

As regeneration cleaning, cleaning with chemicals such as sulfuric acid hydrogen peroxide or ammonia hydrogen peroxide, and physical cleaning by brushes, sponges, or the like are generally used. However, regeneration cleaning with functional water is being studied to prevent damage to photo masks and sulfate ions from remaining on the photo masks.

Functional water is generally defined by the Japanese Society for Functional Water as, among aqueous solutions that have been given reproducible and useful functions by artificial treatment, those for which the scientific basis for treatment and function has been clarified, and those for which such scientific basis is about to be clarified. Specific examples thereof include fine bubble water such as ozone water, hydrogen water, micro-bubble water, and nano-bubble water; electrolyzed water, supercritical water, sub-critical water, and the like. Ozone water and hydrogen water are often used to clean photo masks. In addition, the cleaning power can be improved by adding a small amount of ammonia.

However, the present inventors found that since the cleaning power of functional water was weaker than that of chemicals such as sulfuric acid hydrogen peroxide, in the regeneration cleaning of the photo mask after the removal of the pellicle, residues of the agglutinant layer that fixed the pellicle and the photo mask were difficult to remove only by functional water cleaning. In particular, in phase shift photo masks, damage to phase shift films leads to changes in transmittance and phase difference, and it is thus difficult to add physical cleaning in addition to functional water cleaning.

Moreover, when lithography is performed using an exposure light beam such as ArF excimer laser (193 nm) on a lithography pellicle in which a pellicle film is stretched over the upper end face of a pellicle frame through a pellicle film bonding adhesive material layer, and in which a mask bonding agglutinant layer is provided on the other end face, there is a problem that the agglutinant layer formed on the lower end face of the pellicle frame is altered by the exposure light beam, and many altered parts of the agglutinant layer remain on the exposure original plate as peeling residues when peeling from the exposure original plate.

Attempts have been made so far to reduce residues by adding surface modifiers or the like to agglutinants (IP Publications 1 and 2 described above). Further, as techniques of reducing residues, a large pellicle having an agglutinant layer with a cohesive fracture strength of 20 g/mm$^2$ or more (IP Publication 3 described above), and a pellicle comprising an agglutinant for pellicles and having a ratio of peeling strength and tensile strength of 0.10 or more and 0.33 or less are disclosed (IP Publication 4 described above).

The present invention was made in view of such circumstances, and an object of the present invention is to provide an agglutinant for pellicles that can reduce residues stuck onto an exposure original plate when a pellicle is peeled from the exposure original plate after being used in lithography, in particular ArF lithography, and to also provide a pellicle, an exposure original plate with a pellicle, a method for regenerating an exposure original plate, and a peeling residue reduction method. Another object of the present invention is to provide a method for producing a semiconductor device and a method for producing a liquid crystal display board that can thereby improve production efficiency.

Means to Solve the Problems

The above problems of the present invention have been solved by the following means.

[1] An agglutinant for pellicles for bonding a pellicle to an exposure original plate, the agglutinant comprising a polyvinyl ether compound.

[2] An agglutinant for pellicles as claimed in [1] described above, wherein the polyvinyl ether compound is a polymer comprising vinyl ethers as a monomer component, or a polymer comprising vinyl ethers and a monomer copolymerizable with the vinyl ethers as polymerization components.

[3] An agglutinant for pellicles as claimed in [2] described above, wherein the vinyl ethers are at least one selected from the group consisting of methyl vinyl ether, ethyl vinyl ether, butyl vinyl ether, isobutyl vinyl ether, and (2-methoxyethyl) vinyl ether.

[4] An agglutinant for pellicles as claimed in any one of [1] to [3] described above, further comprising at least one selected from the group consisting of acrylic polymers, silicone resins, and thermoplastic elastomers.

[5] An agglutinant for pellicles as claimed in any one of [1] to [3] described above, further comprising an acrylic polymer, wherein the polyvinyl ether compound is contained in an amount of 0.5 to 10 mass parts based on 100 mass parts of the solid content of the acrylic polymer.

[6] An agglutinant for pellicles as claimed in [4] or [5] described above, wherein the acrylic polymer comprises a (meth)acrylic acid ester having an ether bond as a monomer component.

[7] An agglutinant for pellicles as claimed in [6] described above, wherein the (meth)acrylic acid ester having an ether bond is a (meth)acrylic acid ester having an alkylene oxide group.

[8] An agglutinant for pellicles as claimed in [7] described above, wherein the alkylene oxide group is an ethylene oxide group.

[9] An agglutinant for pellicles as claimed in [4] or [5] described above, wherein the acrylic polymer has a side chain containing an ether bond.

[10] An agglutinant for pellicles as claimed in [9] described above, wherein the side chain containing an ether bond has an alkylene oxide group.

[11] An agglutinant for pellicles as claimed in [10] described above, wherein the alkylene oxide group is an ethylene oxide group.

[12] A pellicle frame with an agglutinant layer, comprising a pellicle frame and an agglutinant layer provided on one end face of the pellicle frame and obtained from an agglutinant for pellicles as claimed in any one of [1] to [11] described above.

[13] A pellicle comprising a pellicle film, a pellicle frame provided with the pellicle film on one end face thereof, and an agglutinant layer provided on the other end face of the pellicle frame and obtained from an agglutinant for pellicles as claimed in any one of [1] to [11] described above.

[14] A pellicle as claimed in [13] described above, wherein the agglutinant layer is irradiated with an exposure light beam.

[15] A pellicle as claimed in [13] described above, which is bonded to a phase shift photo mask.

[16] A pellicle as claimed in [13] described above, wherein the pellicle is bonded to a negative type exposure original plate.

[17] A pellicle as claimed in [13] described above, wherein the pellicle is bonded to an exposure original plate that has a non-shaded area or a semi-transparent shaded area in a portion thereof to which an agglutinant layer is bonded.

[18] A pellicle as claimed in [13] described above, wherein the pellicle is bonded to an exposure original plate that has a transparent area in a portion thereof to which an agglutinant layer is bonded.

[19] A pellicle as claimed in [13] described above, wherein the pellicle is bonded to a face comprising silicon oxide as a main component.

[20] A pellicle as claimed in [19] described above, wherein the face comprising silicon oxide as a main component is a quartz face.

[21] A pellicle as claimed in [13] described above, wherein the pellicle is compatible with regeneration cleaning with functional water.

[22] An exposure original plate with a pellicle, comprising an exposure original plate and a pellicle as claimed in [13] or [14] described above mounted on the exposure original plate.

[23] An exposure original plate with a pellicle as claimed in [22] described above, wherein the exposure original plate is a phase shift photo mask.

[24] An exposure original plate with a pellicle as claimed in [22] described above, wherein the exposure original plate is of negative type.

[25] An exposure original plate with a pellicle as claimed in [22] described above, wherein a portion of the exposure original plate to which the agglutinant layer is bonded has a non-shaded area or a semi-transparent shaded area.

[26] An exposure original plate with a pellicle as claimed in [22] described above, wherein a portion of the exposure original plate to which the agglutinant layer is bonded has a transparent area.

[27] An exposure original plate with a pellicle as claimed in [22] described above, wherein the exposure original plate comprises silicon oxide as a main component.

[28] An exposure original plate with a pellicle as claimed in [22] described above, wherein the exposure original plate is a quartz substrate.

[29] A method for producing a semiconductor device, comprising a step of performing exposure using an exposure original plate with a pellicle as claimed in any one of [22] to [28] described above.

[30] A method for producing a liquid crystal display board, comprising a step of performing exposure using an exposure original plate with a pellicle as claimed in any one of [22] to [28] described above.

[31] A method for regenerating an exposure original plate, comprising peeling a pellicle from an exposure original plate with a pellicle as claimed in any one of [22] to [28] described above, and cleaning residues of an agglutinant remaining on the exposure original plate with functional water to regenerate the exposure original plate.

[32] A peeling residue reduction method comprising, when peeling a pellicle from an exposure original plate to which the pellicle is bonded, reducing peeling residues of an agglutinant layer of the pellicle remaining on the exposure original plate, wherein the method uses a pellicle as claimed in any one of [13] to [21] described above as the pellicle.

[33] An application of a pellicle comprising a pellicle film, a pellicle frame provided with the pellicle film on one end face thereof, and an agglutinant layer provided on the other end face of the pellicle frame and obtained from an agglutinant for the pellicle, wherein the agglutinant layer is irradiated with an exposure light beam.

[34] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is bonded to a phase shift photo mask.

[35] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is bonded to a negative type exposure original plate.

[36] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is bonded to an exposure original plate that has a non-shaded area or a semi-transparent shaded area in a portion thereof to which the agglutinant layer is bonded.

[37] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is bonded to an exposure original plate that has a transparent area in a portion thereof to which the agglutinant layer is bonded.

[38] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is bonded to a face comprising silicon oxide as a main component (in particular, a quartz face).

[39] An application of a pellicle comprising a pellicle film, a pellicle frame provided with the pellicle film on one end face thereof, and an agglutinant layer provided on the other end face of the pellicle frame and obtained from an agglutinant for the pellicle, wherein the pellicle is compatible with regeneration cleaning with functional water.

[40] A peeling residue reduction pellicle comprising a pellicle film, a pellicle frame provided with the pellicle film bonded to one end face thereof, and an agglutinant layer for bonding the pellicle provided on the other end face of the pellicle frame to an exposure original plate, wherein the agglutinant layer is formed from a composition comprising an acrylic resin and a polyvinyl ether compound.

[41] A peeling residue reduction pellicle as claimed in [40] described above, wherein a composition as claimed in [40] described above comprises a polyvinyl ether compound in an amount of 0.5 to 10 mass parts based on 100 mass parts of the solid content of the acrylic resin.

[42] A peeling residue reduction pellicle as claimed in [40] or [41] described above, wherein the peeling residue reduction pellicle is a peeling residue reduction pellicle for ArF lithography.

[43] A method for producing a peeling residue reduction pellicle, the method comprising forming an agglutinant for bonding the pellicle to an exposure original plate from a composition comprising an acrylic resin and a polyvinyl ether compound, applying the agglutinant to one end face of a pellicle frame to form an agglutinant layer, peelably bonding a protective member thereto, applying an adhesive material to the other end face of the pellicle frame, and bonding a pellicle film thereto.

[44] A method for producing a peeling residue reduction pellicle as claimed in [43] described above, wherein the composition comprises a polyvinyl ether compound in an amount of 0.5 to 10 mass parts based on 100 mass parts of the solid content of the acrylic resin.

[45] A method for reducing, when a pellicle is peeled from an exposure original plate to which the pellicle is bonded, peeling residues of an agglutinant layer of the pellicle remaining on the exposure original plate, wherein the method uses a pellicle as claimed in any one of [40] to [42] described above as the pellicle.

Effects of the Invention

The present invention can provide an agglutinant for pellicles that can reduce peeling residues stuck onto an exposure original plate when a pellicle is peeled from the exposure original plate after being used in lithography, in particular ArF lithography, and can also provide a pellicle, an exposure original plate with a pellicle, a method for regenerating an exposure original plate, and a peeling residue reduction method.

According to the pellicle, exposure original plate with a pellicle, method for regenerating an exposure original plate, and peeling residue reduction method of the present invention, even when an exposure light beam is applied through the exposure original plate, the pellicle can be peeled from the exposure original plate with very few peeling residues of the agglutinant. As a result, the regeneration cleaning of the exposure original plate, from which the pellicle is removed, can proceed smoothly, and the cleaning conditions can be loosened; thus, there is an advantage in reducing damage to the exposure original plate surface during cleaning. In addition, production efficiency can be improved in the production of semiconductor devices and liquid crystal display boards.

BRIEF DESCRIPTION OF DRAWINGS

FIG. 1 A conceptual diagram showing the basic structure of the pellicle of the present invention.

EXAMPLES TO EMBODY THE INVENTION

First, the basic structure of the pellicle of the present invention will be described with reference to FIG. 1.

As shown in FIG. 1, the pellicle 10 of the present invention is such that a pellicle film 12 is stretched over the upper end face of a pellicle frame 11 through an adhesive material layer 13 for bonding the pellicle film. In this case, an agglutinant layer 14 for bonding the pellicle 10 to an exposure original plate (mask substrate or reticle) 1 is generally formed on the lower end face of the pellicle frame 11, and a liner (not shown) is peelably bonded to the lower end face of the agglutinant layer 14. In addition, the pellicle frame 11 may be provided with an air pressure adjustment hole (vent) 15, and may be further provided with a dust removal filter 16 for the purpose of removing particles.

In this case, the size of these pellicle constituent members is equivalent to that of general pellicles, for example, pellicles for semiconductor lithography and pellicles for the lithography step in the production of large liquid crystal display boards. Moreover, the materials thereof can be known materials as described above.

The type of pellicle film 12 is not particularly limited. For example, amorphous fluoropolymers conventionally used for excimer laser are used. Examples of amorphous fluoropolymers include Cytop (trade name of AGC Inc.), Teflon (registered trademark) AF (trade name of DuPont), and the like. These polymers may be used after being dissolved in solvents, if necessary, during the production of pellicle films, and can be suitably dissolved, for example, in fluorine type solvents.

As for the base material of the pellicle frame 11, for example, aluminum alloy materials, preferably JIS A7075, JIS A6061, and JIS A5052 materials, are used. When an aluminum alloy material is used, there is no particular limitation as long as the strength as the pellicle frame is ensured. The pellicle frame surface is preferably roughened by sandblasting or chemical polishing, and a polymer coating may be provided after roughening. In the present invention, a conventionally known method can be employed as the method for roughening the frame surface. In a preferable method, the surface of an aluminum alloy material is subjected to blast treatment using stainless steel, carborundum, glass beads, or the like, and is further subjected to chemical polishing using NaOH or the like, thereby roughening the surface.

By the way, the present inventors conducted many discussions and experiments in order to solve the above problems of the present invention, particularly focused on the feature of the agglutinant forming the agglutinant layer, and comparatively analyzed the experimental results. As a result, the present inventors found that the following means was effective.

That is, because a polyvinyl ether compound is contained in an agglutinant for bonding a pellicle to an exposure original plate, peeling residues of the agglutinant layer remaining on the exposure original plate can be reduced when the pellicle is peeled from the exposure original plate. Even if the agglutinant layer is irradiated with an exposure light beam (e.g., 193-nm ultraviolet rays) during use of the pellicle, peeling residues can be easily suppressed. As a result, the regeneration cleaning of the mask substrate, from which the pellicle is peeled, proceeds smoothly, the cleaning conditions can be loosened, and there is an advantage in reducing damage to the mask surface during cleaning. Although the action of capable of reducing peeling residues is not clarified, it is assumed that when a polyvinyl ether compound is contained in an agglutinant, it becomes easy to control hydrophilicity as the agglutinant, and cohesive force as the agglutinant can be improved.

Examples of the polyvinyl ether compound include homopolymers of vinyl ethers, such as methyl vinyl ether, ethyl vinyl ether, butyl vinyl ether, isobutyl vinyl ether, and (2-methoxyethyl) vinyl ether; copolymers of two or more vinyl ethers; copolymers of these vinyl ethers and other monomers; and the like. Among these, polyvinyl ether compounds containing methyl vinyl ether as a raw material monomer component are preferable in terms of the control of peeling residues.

The agglutinant for pellicles may contain other high-molecular-weight components in addition to the polyvinyl ether compound. Examples of such high-molecular-weight components include acrylic polymers (also referred to as acrylic resins), silicone resins, thermoplastic elastomers, and the like. Since various monomer components can be selected for acrylic polymers, design suitable for the required agglutinant characteristics can be easily made. Silicone resins have excellent balance between light resistance, adhesion characteristics, peeling characteristics, etc. Thermoplastic elastomers are highly cost competitive.

These high-molecular-weight components are preferably compatible with the polyvinyl ether compound. Due to the higher compatibility, the vinyl ether group can be uniformly dispersed in the agglutinant layer, which is considered to lead to an improvement in peeling characteristics. If the compatibility is low, a polymer-blend state in which substantially uniform dispersion can be maintained under the use conditions of the agglutinant for pellicles within use period is preferable. Here, the polymer-blend state refers to a state in which a mixture of the polyvinyl ether compound and the high-molecular-weight component can form a thin film (e.g., 20-μm thin film), or a state in which the mixture remains transparent. In order to maintain such states, mixing may be performed using a compatibilizing agent and a solvent that can dissolve both the polyvinyl ether compound and the high-molecular-weight component.

The acrylic polymer mentioned above is, for example, a polymer comprising a (meth)acrylic acid ester as a monomer component, and a monomer component copolymerizable with the (meth)acrylic acid ester can be copolymerized, if necessary. Examples of the (meth)acrylic acid ester include (meth)acrylic acid esters having an ether bond, (meth)acrylic acid alkyl esters, unsaturated monomers having a carboxyl group or a hydroxyl group, and the like. When a (meth)acrylic acid ester having an ether bond is contained as a monomer component, the ether bond can be introduced into the side chain of the acrylic polymer.

Examples of the (meth)acrylic acid ester having an ether bond ((A) component) include (meth)acrylic acid esters having an alkylene oxide group, such as an ethylene oxide group, a propylene oxide group, or a butylene oxide group. Among these, (meth)acrylic acid esters having an ethylene oxide group (also referred to as ethylene oxide group-containing (meth)acrylates) are preferable. Examples thereof include methoxypolyethylene glycol (meth)acrylates, such as 2-methoxyethyl (meth)acrylate, 2-ethoxyethyl (meth)acrylate, 2-butoxyethyl (meth)acrylate, phenoxyethylene glycol (meth)acrylate, and methoxydiethylene glycol (meth)acrylate; ethoxypolyethylene glycol (meth)acrylates, such as ethoxydiethylene glycol (meth)acrylate; butoxypolyethylene glycol (meth)acrylates, such as butoxydiethylene glycol (meth)acrylate; phenoxypolyethylene glycol (meth)acrylates, such as phenoxydiethylene glycol (meth)acrylate; and the like. These may be used singly or in combination of two or more.

Examples of the (meth)acrylic acid alkyl ester ((B) component) include (meth)acrylic acid alkyl esters having a $C_{1-14}$ alkyl group, and the like. Specific examples thereof include methyl (meth)acrylate, ethyl (meth)acrylate, propyl (meth)acrylate, n-butyl (meth)acrylate, isobutyl (meth)acrylate, isoamyl (meth)acrylate, hexyl (meth)acrylate, 2-ethylhexyl (meth)acrylate, n-octyl (meth)acrylate, isooctyl (meth)acrylate, isononyl (meth)acrylate, lauryl (meth)acrylate, and the like. Among these, (meth)acrylic acid alkyl esters having a $C_4$ or $C_8$ alkyl group are preferable, in terms of satisfying both agglutinant characteristics and peeling characteristics. These may be used singly or in combination of two or more.

Examples of the unsaturated monomer having a carboxyl group or a hydroxyl group ((C) component) include α,β-unsaturated carboxylic acids, such as (meth)acrylic acid, maleic acid, crotonic acid, itaconic acid, and fumaric acid; hydroxyl group-containing methacrylates, such as 2-hydroxyethyl (meth)acrylate, 2-hydroxypropyl (meth)acrylate, and 2-hydroxybutyl (meth)acrylate; and the like. These may be used singly or in combination of two or more.

The ratio of the (A) component used in the acrylic polymer is preferably 30 mass % or more, more preferably 35 mass % or more, particularly preferably 35 to 98 mass %, and extremely preferably 40 to 95 mass %, in the whole monomer components. Because of the ratio of the (A) component within the above range, it becomes easy to control peeling residues and light resistance.

The ratio of the (B) component used in the acrylic polymer is preferably 0 to 70 mass %, and more preferably 3 to 55 mass %, in the whole monomer components. Because of the ratio of the (B) component within the above range, it becomes easy to control adhesion.

The ratio of the (C) component used in the acrylic polymer is preferably 0 to 10 mass %, and more preferably 2 to 8 mass % in the whole monomer components. Because of the ratio of the (C) component within the above range, it becomes easy to control peeling residues and the degree of crosslinking due to the reaction with a curing agent.

The acrylic polymer can be produced, for example, by selecting a known production method, such as solution polymerization, bulk polymerization, emulsion polymerization, or radical polymerization. Further, the obtained acrylic polymer may be any of a random copolymer, a block copolymer, a graft copolymer, and the like.

When the molecular weight of the acrylic polymer is within the range of 700,000 to 2.5 million as weight average molecular weight, the agglutinant layer has moderate cohesive force and adhesive strength, and the agglutinant causes less adhesive residues and has sufficient adhesive strength and load resistance, which is preferable.

The weight average molecular weight mentioned above is a value measured by gel permeation chromatography (GPC) analysis, and refers to a value in terms of standard polystyrene. The GPC analysis can be performed using tetrahydrofuran (THF) as an eluent.

In the present embodiment, a reaction product of the acrylic polymer and a curing agent is preferably contained as the agglutinant of the agglutinant layer; however, in terms of flexibility, an acrylic polymer that does not react with the curing agent may be contained.

The curing agent is not particularly limited as long as it is a curing agent that is used as a general agglutinant, and examples thereof include metal salts, metal alkoxides, aldehyde type compounds, non-amino resin type amino compounds, urea type compounds, isocyanate type compounds, polyfunctional epoxy compounds, metal chelate type compounds, melamine type compounds, aziridine type compounds, and the like. Among these, isocyanate type compounds and epoxy compounds are preferable, in terms of the reactivity with the carboxyl group or the hydroxyl group.

Examples of isocyanate type compounds include xylylene diisocyanate, hexamethylene diisocyanate, tolylene diisocyanate, and multimers, derivatives, and polymers thereof, and the like. These may be used singly or in combination of two or more.

Examples of epoxy compounds include compounds having two or more epoxy groups in the molecule, and specific examples thereof include ethylene glycol diglycidyl ether, polyethylene glycol diglycidyl ether, glycerin diglycidyl ether, glycerin triglycidyl ether, 1,6-hexanediol diglycidyl ether, trimethylolpropane triglycidyl ether, diglycidylaniline, diamine glycidylamine, N,N,N',N'-tetraglycidyl-m-xylylenediamine, 1,3-bis(N,N'-diamineglycidylaminomethyl), and the like. These may be used singly or in combination of two or more.

As the silicone resin, for example, silicone resins known as agglutinants can be suitably used. Specific examples thereof include those obtained by partial dehydration condensation of an organopolysiloxane having silanol groups at both ends of the molecular chain, with an organopolysiloxane having a triorganosiloxane unit represented by $R_3SiO_{0.5}$ (wherein R is a substituted or unsubstituted monovalent hydrocarbon group) and an $SiO_2$ unit in the molecule, and the like. These are available as silicone type agglutinants KR-101-10, KR-120, KR-130, and X-40-3068 (all are trade names of Shin-Etsu Chemical Co., Ltd.).

Examples of the thermoplastic elastomer include styrene type thermoplastic elastomers, (meth)acrylic acid ester type thermoplastic elastomers, olefin type thermoplastic elastomers, and the like. More specifically, the thermoplastic elastomer described in Japanese Patent No. 5513616 can be used.

Among these high-molecular-weight components, acrylic polymers are preferable because the mixability with the polyvinyl ether compound can be easily controlled. These high-molecular-weight components may be used singly or in combination of two or more.

In the present invention, the content of the polyvinyl ether compound is preferably 0.5 mass parts or more, more preferably 0.5 to 10 mass parts, and particularly preferably 3 to 7 mass parts, based on 100 mass parts of the solid content of the high-molecular-weight component. When the content of the polyvinyl ether compound is 0.5 mass parts or more, it becomes easy to control the increase of peeling residues due to ultraviolet irradiation. Moreover, when the content of the polyvinyl ether compound is 10 mass parts or less, stable pellicle bonding performance can be easily obtained.

In addition, the agglutinant (the composition described above) that forms the agglutinant layer of the pellicle may be mixed with other components, such as crosslinking agents, tackifiers, plasticizers, stabilizers, viscosity regulators, antistatic agents, lubricants, conductivity-imparting agents, flame retardancy-imparting agents, thermal conductivity-improving agents, heat resistance-improving agents, weather resistance-improving agents, thixotropy-imparting agents, antioxidants, antimicrobial agents, antifungal agents, and coloring agents, depending on the purpose within the range in which the characteristics of the present invention are not impaired.

In order to reduce distortion and other influences on the mask substrate to which the pellicle is bonded, and to suppress residual stress due to pellicle bonding, the shape of the agglutinant layer 14 is preferably a flat shape that is less likely to deform during bonding of the pellicle.

As the means for forming the agglutinant layer 14, an uncured liquid or paste agglutinant is applied to the lower end face of the pellicle frame 11, followed by curing treatment, thereby forming an agglutinant layer. The agglutinant may be applied once, or may be repeatedly applied several times in order to obtain a predetermined thickness of the agglutinant layer. In this case, the agglutinant is preferably allowed to stand between each time of coating until the shape of the agglutinant after coating is stabilized. If it is difficult to apply an agglutinant due to its high viscosity, the agglutinant may be applied, if necessary, after dilution with an organic solvent, alcohol, water, or the like to reduce the viscosity of the agglutinant. The agglutinant can be applied, for example, by dipping, spraying, or brush coating, or by using a coating device with a dispenser or the like. Coating using a coating device with a dispenser is preferable, in terms of stability, workability, yield, and the like.

In the production of the pellicle 10, the coating and formation of the agglutinant layer 14 are generally performed first, followed by stretching of the pellicle film 12; however, the order may be reversed. For stretching the pellicle film 12, for example, an adhesive material is applied to the upper end face of the pellicle frame 11, and the pellicle frame 11 is then heated to cure the adhesive material. Finally, the upper end face of the pellicle frame 11, on which the adhesive material layer 13 for bonding a pellicle film is formed, is bonded to a pellicle film taken in an aluminum frame larger than the pellicle frame 11, and extra portions of the pellicle film protruding outside the pellicle frame 11 are removed, thereby completing the pellicle.

Due to the use of the pellicle of the present invention with the configuration described above, the amount of agglutinant residues can be reduced when the pellicle is peeled from the exposure original plate after being used in lithography. Moreover, the present invention provides a method for reducing peeling residues of the agglutinant layer of the pellicle by using the pellicle of the present invention. Therefore, the pellicle of the present invention is useful as a pellicle bonded to a phase shift photo mask having the delicate phase shift film mentioned above, or a face comprising silicon oxide, such as quartz, as a main component.

The pellicle of the present invention is also useful as a pellicle applied to exposure original plates whose agglutinant layer is irradiated with an exposure light beam during exposure, such as a negative type exposure original plate, an exposure original plate that has a non-shaded area or a semi-transparent shaded area in a portion thereof to which an agglutinant is bonded, and an exposure original plate that has a transparent area in a portion thereof to which an agglutinant is bonded. The agglutinant layer of the pellicle used in such an exposure original plate is exposed to an exposure light beam through the exposure original plate from the face of the exposure original plate opposite to the face provided with the pellicle.

The pellicle of the present invention may be used not only as a protective member for suppressing the adhesion of foreign substances to the exposure original plate in the exposure device, but also as a protective member for protecting the exposure original plate during storage or transportation of the exposure original plate. An exposure original plate with a pellicle can be produced by mounting the pellicle described above on an exposure original plate, such as a photo mask.

The method for producing a semiconductor device or a liquid crystal display board according to the present embodiment comprises a step of exposing a substrate (semiconductor wafer or liquid crystal original plate) using the exposure original plate with a pellicle described above. For example, in the lithography step, which is one of the steps for producing semiconductor devices or liquid crystal display boards, in order to form a photoresist pattern corresponding to an integrated circuit etc. on a substrate, the exposure original plate with a pellicle described above is set on a stepper to perform exposure. As a result, if foreign substances adhere to the pellicle in the lithography step, the foreign substances do not form images on the wafer coated with a photoresist; thus, the short circuit, disconnection, and the like of the integrated circuit etc. due to images of the foreign substances can be prevented. Therefore, the use of the exposure original plate with a pellicle can improve the yield in the lithography step.

In general, when a desired number of times of lithography steps are performed, when foreign substances and haze are generated, or when the pellicle film is damaged, the pellicle is peeled from the exposure original plate, and the exposure original plate is subjected to regeneration cleaning in some cases. Due to the use of the pellicle of the present invention, peeling residues during repellicle can be reduced even in the case of exposure original plates whose agglutinant layer is irradiated with an exposure light beam during exposure, such as an exposure original plate having a face comprising silicon oxide as a main component in which peeling residues of the agglutinant layer are likely to be generated, a negative type exposure original plate whose agglutinant layer is irradiated with an exposure light beam more than before, an exposure original plate that has a non-shaded area or a semi-transparent shaded area in a portion thereof to which an agglutinant is bonded, whose agglutinant layer is irradiated with an exposure light beam more than before, and an exposure original plate that has a transparent area in a portion thereof to which an agglutinant is bonded, whose agglutinant layer is irradiated with an exposure light beam more than before.

Moreover, since the use of the pellicle of the present invention can reduce peeling residues of the agglutinant layer, cleaning with functional water can be easily applied, and cleaning properties for delicate exposure original plates, such as phase shift photo masks, can be improved. In addition, the use of the pellicle of the present invention can contribute to the reduction of environmental burden caused by cleaning with functional water.

EXAMPLES

The present invention will be described in more detail below with reference to Examples. The "mask" in the Examples and Comparative Examples is described as an example of the "exposure original plate." Needless to say, it can also be applied to reticles.

Example 1

After a pellicle frame (external size: 149 mm×115 mm×3 mm, thickness: 2 mm, flatness of an end face coated with a mask bonding agglutinant: 15 um) made of an aluminum alloy was subjected to precision cleaning, an acrylic agglutinant solution manufactured by Soken Chemical Co., Ltd. (product name: SK-Dyne SN-70A, a solution containing, as a base material, 30 mass % (solid content) of an acrylic polymer in which 95 mass % of monomer components was an ethylene oxide group-containing (meth)acrylate, and 2 mass % (solid content) of a polyvinyl ether compound) was applied to the end face with a flatness of 15 um, and allowed to stand for 60 minutes at room temperature. Thereafter, a separator was placed on an aluminum plate with a flatness of 5 um, and the pellicle frame coated with the agglutinant was placed so that the agglutinant faced down. Thus, the agglutinant was brought into contact with the flat separator and flattened.

Next, the pellicle on the aluminum plate was placed in an oven at 60° C. for 60 minutes to cure the agglutinant.

After the pellicle together with the aluminum plate was taken out from the oven, the separator was peeled.

Thereafter, an adhesive material manufactured by AGC Inc. (trade name: Cytop CTX-A) was applied to the end face opposite to the end face coated with the agglutinant. Then, the pellicle frame was heated at 130° C. to cure the adhesive material.

Finally, the adhesive material-coated end face of the pellicle frame was bonded to a pellicle film taken in an aluminum flame larger than the pellicle frame, and portions outside the pellicle frame were removed, thereby completing the pellicle.

Next, a 6025 mask substrate and the previously prepared pellicle were set in a bonding device, and pressurized at a bonding load of 50 N for a load time of 30 seconds to bond the pellicle to the mask substrate.

After the mask substrate to which the pellicle was bonded was left for 24 hours at room temperature, the back surface of the mask was irradiated with ultraviolet rays at 10 mJ/cm$^2$ using a 193-nm ultraviolet lamp so that the light beam was applied to the pellicle agglutinant.

After ultraviolet irradiation, the resultant was left for 1 hour at room temperature, and then the pellicle was slowly peeled upward from the mask substrate at a speed of 0.1 mm/sec.

When the mask substrate after peeling was visually observed, a slightly pale band was found in the contour portion to which the pellicle was bonded, and the mask substrate was so clean that almost no peeling residue was confirmed. The residues could be removed by dipping in a cleaning tank using functional water (hydrogen and ammonia were added to ultrapure water) in combination with ultrasonic waves (functional water overflowed) for 5 minutes.

Example 2

A pellicle was completed in the same manner using the same materials as in Example 1, except that the agglutinant used herein was an agglutinant containing 5 mass parts of a polyvinyl ether compound based on 100 mass parts of an acrylic agglutinant solution manufactured by Soken Chemical Co., Ltd. (product name: SK-Dyne SK-1495S, a solution with a solid content of 30 mass % containing, as a base material, an acrylic polymer not containing a (meth)acrylic acid ester having an ether bond as a monomer component). Further, the pellicle was bonded to and peeled from a mask substrate under the same conditions as in Example 1.

When the mask substrate after peeling was visually observed, a slightly pale band was found in the contour portion to which the pellicle was bonded, and the mask substrate was so clean that almost no peeling residue was confirmed. The residues could be removed by dipping in a cleaning tank using functional water (hydrogen and ammonia were added to ultrapure water) in combination with ultrasonic waves (functional water overflowed) for 5 minutes, as in Example 1.

Example 3

A pellicle was completed in the same manner using the same materials as in Example 1, except that the agglutinant used herein was an agglutinant containing 2 mass parts of a polyvinyl ether compound based on 100 mass parts of an acrylic agglutinant solution manufactured by Soken Chemical Co., Ltd. (product name: SK-Dyne SN-70A). Further, the pellicle was bonded to and peeled from a mask substrate under the same conditions as in Example 1.

When the mask substrate after peeling was visually observed, a slightly pale band was found in the contour portion to which the pellicle was bonded, and the mask substrate was so clean that almost no peeling residue was confirmed. The residues could be removed by dipping in a cleaning tank using functional water (hydrogen and ammonia were added to ultrapure water) in combination with ultrasonic waves (functional water overflowed) for 3 minutes, as in Examples 1 and 2.

Example 4

A pellicle was completed in the same manner using the same materials as in Example 1, except that the agglutinant used herein was an agglutinant containing 11 mass parts of a polyvinyl ether compound based on 100 mass parts of an acrylic agglutinant solution manufactured by Soken Chemical Co., Ltd. (product name: SK-Dyne SK-1495S). Further, the pellicle was bonded to and peeled from a mask substrate under the same conditions as in Example 1.

When the mask substrate after peeling was visually observed, a slightly pale band was found in the contour portion to which the pellicle was bonded, and the mask substrate was so clean that almost no peeling residue was confirmed. The residues could be removed by dipping in a cleaning tank using functional water (hydrogen and ammonia were added to ultrapure water) in combination with ultrasonic waves (functional water overflowed) for 3 minutes, as in Examples 1 to 3.

Example 5

A pellicle was completed in the same manner using the same materials as in Example 1, except that the agglutinant used herein was an agglutinant containing 3 mass parts of a polyvinyl ether compound based on 100 mass parts of an acrylic agglutinant solution manufactured by Soken Chemical Co., Ltd. (product name: SK-Dyne SK-1425S, a solution with a solid content of 30 mass % containing, as a base material, an acrylic polymer not containing a (meth)acrylic acid ester having an ether bond as a monomer component). Further, the pellicle was bonded to and peeled from a mask substrate under the same conditions as in Example 1.

When the mask substrate after peeling was visually observed, pale solute residues of the agglutinant were found in the portion to which the pellicle was bonded. In this case, the peeling residues could also be eventually removed by performing ultrasonic cleaning with functional water for 5 minutes 5 times.

Comparative Example 1

A pellicle was completed in the same manner using the same materials as in Example 1, except that the agglutinant used herein was an acrylic agglutinant solution manufactured by Soken Chemical Co., Ltd. (product name: SK-Dyne SK-1495S) alone, without using a polyvinyl ether compound. Further, the pellicle was bonded to and peeled from a mask substrate under the same conditions as in Example 1.

When the mask substrate after peeling was visually observed, pale agglutinant residues were found in the portion to which the pellicle was bonded. The peeling residues could not be completely removed by cleaning for 5 minutes twice using the same equipment as in Example 1. Accordingly, light rubbing using a foamed polyvinyl alcohol was necessary before cleaning described above.

Comparative Example 2

A pellicle was completed in the same manner using the same materials as in Example 1, except that the agglutinant used herein was an acrylic agglutinant solution manufactured by Soken Chemical Co., Ltd. (product name: SK-Dyne SK-1425S) alone, without using a polyvinyl ether compound. Further, the pellicle was bonded to and peeled from a mask substrate under the same conditions as in Example 1.

When the mask substrate after peeling was visually observed, pale agglutinant residues were found in the portion to which the pellicle was bonded. The peeling residues could not be completely removed by cleaning for 5 minutes twice using the same equipment as in Example 1. Accordingly, light rubbing using a foamed polyvinyl alcohol was necessary before cleaning described above.

The results of the Examples confirmed that due to the use of an acrylic polymer containing a polyvinyl ether as an agglutinant, even when 193-nm ultraviolet rays were applied after bonding a pellicle to an exposure substrate, almost no peeling residue remained on the exposure substrate, and the pellicle was well peeled.

EXPLANATION FOR REFERENCE NUMERALS

1: exposure original plate
10: pellicle
11: pellicle frame
12: pellicle film
13: adhesive material layer for bonding pellicle film
14: agglutinant layer
15: air pressure adjustment hole (vent)
16: dust removal filter

The invention claimed is:

1. A pellicle frame with an agglutinant layer, comprising a pellicle frame and an agglutinant layer provided on one end face of the pellicle frame, wherein
   the agglutinant layer is provided on a side of the pellicle frame that is bonded to an exposure original plate,
   the agglutinant layer comprises an agglutinant comprising a polyvinyl ether compound,
   the polyvinyl ether compound is a polymer comprising vinyl ethers as a monomer component, or a polymer comprising vinyl ethers and a monomer copolymerizable with the vinyl ethers as polymerization components, and
   the vinyl ethers are at least one selected from the group consisting of methyl vinyl ether, ethyl vinyl ether, butyl vinyl ether, isobutyl vinyl ether, and (2-methoxyethyl) vinyl ether.

2. The pellicle frame as claimed in claim 1, wherein the agglutinant layer further comprises at least one selected from the group consisting of acrylic polymers, silicone resins, and thermoplastic elastomers.

3. The pellicle frame as claimed in claim 2, wherein the acrylic polymer comprises a (meth)acrylic acid ester having an ether bond as a monomer component.

4. The pellicle frame as claimed in claim 3, wherein the (meth)acrylic acid ester having an ether bond is a (meth)acrylic acid ester having an alkylene oxide group.

5. The pellicle frame as claimed in claim 4, wherein the alkylene oxide group is an ethylene oxide group.

6. The pellicle frame as claimed in claim 1, wherein the agglutinant layer further comprises an acrylic polymer, wherein the polyvinyl ether compound is contained in an amount of 0.5 to 10 mass parts based on 100 mass parts of the solid content of the acrylic polymer.

7. A pellicle frame with the agglutinant layer as claimed in claim 6, wherein the acrylic polymer comprises a (meth)acrylic acid ester having an ether bond as a monomer component.

8. A pellicle frame with the agglutinant layer as claimed in claim 7, wherein the (meth)acrylic acid ester having an ether bond is a (meth)acrylic acid ester having an alkylene oxide group.

9. A pellicle frame with the agglutinant layer as claimed in claim 8, wherein the alkylene oxide group is an ethylene oxide group.

10. A pellicle comprising a pellicle film and the pellicle frame as claimed in claim 1.

11. An exposure original plate with the pellicle, comprising an exposure original plate and the pellicle as claimed in claim 10 mounted on the exposure original plate.

12. A method for producing a semiconductor device, comprising a step of performing exposure using the exposure original plate with the pellicle as claimed in claim 11.

13. A method for producing a liquid crystal display board, comprising a step of performing exposure using the exposure original plate with the pellicle as claimed in claim 11.

14. A method for regenerating the exposure original plate, comprising peeling the pellicle from an exposure original plate with the pellicle as claimed in claim 11, and cleaning residues of an agglutinant remaining on the exposure original plate with functional water to regenerate the exposure original plate.

15. A peeling residue reduction method comprising, when peeling the pellicle from the exposure original plate to which the pellicle is bonded, reducing peeling residues of the agglutinant layer of the pellicle remaining on the exposure original plate, wherein the method uses the pellicle as claimed in claim 10 as the pellicle.

16. An exposure method comprising performing exposure using an exposure original plate with the pellicle as claimed in claim 10.

* * * * *